United States Patent
Simons

(10) Patent No.: US 9,306,498 B2
(45) Date of Patent: Apr. 5, 2016

(54) CURRENT DRIVEN FLOATING DRIVER CIRCUIT

(71) Applicant: NXP B.V., Eindhoven (NL)

(72) Inventor: Sven Simons, Graz (AT)

(73) Assignee: NXP B.V., Eindhoven (NL)

( * ) Notice: Subject to any disclaimer, the term of this patent is extended or adjusted under 35 U.S.C. 154(b) by 111 days.

(21) Appl. No.: 14/180,025

(22) Filed: Feb. 13, 2014

(65) Prior Publication Data

US 2015/0229271 A1    Aug. 13, 2015

(51) Int. Cl.
| | | |
|---|---|---|
| *H03C 3/00* | (2006.01) | |
| *H03C 5/00* | (2006.01) | |
| *H03K 17/95* | (2006.01) | |
| *H03K 7/02* | (2006.01) | |
| *H03C 1/00* | (2006.01) | |
| *H04L 27/00* | (2006.01) | |
| *G06K 19/07* | (2006.01) | |
| *H04L 27/04* | (2006.01) | |
| *H03C 1/36* | (2006.01) | |
| *H03C 3/24* | (2006.01) | |
| *H04L 27/20* | (2006.01) | |

(52) U.S. Cl.
CPC .............. *H03C 5/00* (2013.01); *G06K 19/0723* (2013.01); *H03C 1/00* (2013.01); *H03C 1/36* (2013.01); *H03C 3/00* (2013.01); *H03C 3/245* (2013.01); *H03K 7/02* (2013.01); *H03K 17/95* (2013.01); *H04L 27/00* (2013.01); *H04L 27/04* (2013.01); *H03C 2200/0079* (2013.01); *H03K 17/9547* (2013.01); *H04L 27/2032* (2013.01)

(58) Field of Classification Search
CPC ..... H04L 27/2092; H04L 27/00; H04L 27/02; H03C 3/00; H03C 1/00; H03K 7/02; H03K 17/07; H03K 17/95; H03L 27/04
USPC .................. 332/144, 149, 105; 375/300, 308; 340/10.1, 572.2
See application file for complete search history.

(56) References Cited

U.S. PATENT DOCUMENTS

| | | | |
|---|---|---|---|
| 4,068,189 A | 1/1978 | Wilson | |
| 6,650,111 B2 * | 11/2003 | Christensen | ............ 324/207.26 |
| 7,330,708 B2 * | 2/2008 | Umewaka et al. | ......... 455/193.1 |
| 2008/0169826 A1 | 7/2008 | Bartling | |
| 2011/0007846 A1 | 1/2011 | Marien | |
| 2013/0129016 A1 | 5/2013 | Arnold et al. | |

FOREIGN PATENT DOCUMENTS

| | | |
|---|---|---|
| EP | 1 538 036 A1 | 6/2015 |
| JP | 2010-193258 A | 9/2010 |

OTHER PUBLICATIONS

Extended European Search Report for EP Patent Appln. No. 15154619.9 (Jun. 26, 2015).

* cited by examiner

*Primary Examiner* — Arnold Kinkead
(74) *Attorney, Agent, or Firm* — Rajeev Madnawat

(57) ABSTRACT

A circuit for generating a modulated signal is disclosed. The circuit includes a constant current source. The circuit further includes a first switch that is coupled to the constant current source. The circuit also includes a second switch that is coupled to the first switch and a ground. The first switch and the second switch are coupled to a third switch. The third switch is coupled to a first integrated circuit pad. The first integrated circuit pad is defined to be used for coupling the third switch to a resonance circuit.

19 Claims, 6 Drawing Sheets

US 9,306,498 B2

CURRENT DRIVEN FLOATING DRIVER CIRCUIT

BACKGROUND

Keyless entry systems are becoming increasingly prevalent at least in the automobile industry. A keyless entry system primarily includes a transponder and a base station. The transponder communicates with the base station wirelessly. Security codes are employed to prevent unauthorized communication as for example, a base station will respond to requests only from a keyless entry key programmed to be associated with that particular base station. With keyless entry system, a mechanical key to open doors, for example, is not needed. The key typically includes a few buttons that are preprogrammed or can be programmed to send a preprogrammed set of instructions to the base station to perform specific operations. For example, a button may be programmed to open or close automobile doors or start the engine.

The keyless entry systems key typically includes a transponder that communicates with the base station. The transponder includes an electronic circuit that sends and receives communication signals to/from the base station that is located inside the automobile. The term automobile is used generally. The description provided in this document may equally apply to other types of machines as well. The base station is programmed to communicate the control systems of the automobile to effectuate performance of requests received from the transponder.

The communication between the transponder and the base station typically requires active stimulation of oscillation in a resonance circuit that is incorporated in the transponder. The resonance circuit typically is or includes a LC oscillator. The LC oscillator includes a coil (L) and a capacitor (C). The LC oscillator may also include a resistor to tune the Q-factor of the LC Oscillator.

Oscillators are circuits that generate a continuous voltage output waveform at a required frequency with the values of the inductors, capacitors or resistors forming a frequency selective LC resonant tank circuit and feedback network. The LC oscillators frequency is controlled using a tuned or resonant inductive/capacitive (LC) circuit with the resulting output frequency being known as the Oscillation Frequency. By making the oscillators feedback a reactive network the phase angle of the feedback will vary as a function of frequency and this is called Phase-shift.

Oscillators convert a DC input (the supply voltage) into an AC output (the waveform), which can have a wide range of different wave shapes and frequencies that can be either complicated in nature or simple sine waves depending upon the application. Oscillators are also used producing either sinusoidal sine waves, square, saw tooth or triangular shaped waveforms or just a train of pulses of a variable or constant width. LC Oscillators are commonly used in radio-frequency circuits because of their good phase noise characteristics and their ease of implementation.

Typically the active stimulation of oscillation in the resonant circuit is implemented by connecting one side of the coil fix to supply and pulling down the other side towards ground. This setup is a single ended configuration of the coil.

In a transponder that is used in Passive Keyless Entry systems, typically includes an active receiver with high sensitivity. The single ended coil configuration is potentially susceptible to noise coupling, e.g., due to startup of a processor (CPU).

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In one embodiment, a circuit for generating a modulated signal is disclosed. The circuit includes a constant current source. The circuit further includes a first switch that is coupled to the constant current source. The circuit also includes a second switch that is coupled to the first switch and a ground. The first switch and the second switch are coupled to a third switch. The third switch is coupled to a first integrated circuit pad. The first integrated circuit pad is defined to be used for coupling the third switch to a resonance circuit.

In another embodiment, a circuit for generating a modulated signal is disclosed. The circuit includes a first constant current source and a first switch that is coupled to the constant current source. The circuit also includes a second switch coupled to the first switch and a ground. The first switch and the second switch are coupled to a third switch. The third switch is coupled to a first integrated circuit pad. The circuit further includes a second current source coupled to a fourth switch that is coupled to a fifth switch. The fifth switch is coupled to a sixth switch. The sixth switch is coupled to a second integrated circuit pad.

In yet another embodiment, a circuit for generating a modulated signal is disclosed. The circuit includes a first constant current source and a first switch that is coupled to the constant current source. The circuit also includes a second switch that is coupled to the first switch and a ground. The first switch and the second switch are coupled to a third switch. The third switch is coupled to a first integrated circuit pad. The circuit further includes a second current source coupled to a fourth switch that is coupled to a fifth switch. The fifth switch is coupled to a sixth switch. The sixth switch is coupled to a second integrated circuit pad.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments. Advantages of the subject matter claimed will become apparent to those skilled in the art upon reading this description in conjunction with the accompanying drawings, in which like reference numerals have been used to designate like elements, and in which:

DETAILED DESCRIPTION

When a constant voltage but of varying frequency is applied to a circuit consisting of an inductor, capacitor and resistor the reactance of both the Capacitor/Resistor and Inductor/Resistor circuits is to change both the amplitude and the phase of the output signal as compared to the input signal due to the reactance of the components used. At high frequencies the reactance of a capacitor is very low acting as a short circuit while the reactance of the inductor is high acting as an open circuit. At low frequencies the reverse is true, the reactance of the capacitor acts as an open circuit and the reactance of the inductor acts as a short circuit.

Between these two extremes the combination of the inductor and capacitor produces a "Tuned" or "Resonant" circuit that has a Resonant Frequency, in which the capacitive and inductive reactance's are equal and cancel out each other, leaving only the resistance of the circuit to oppose the flow of current. This means that there is no phase shift as the current is in phase with the voltage. Consider the circuit below.

Figure 1A:
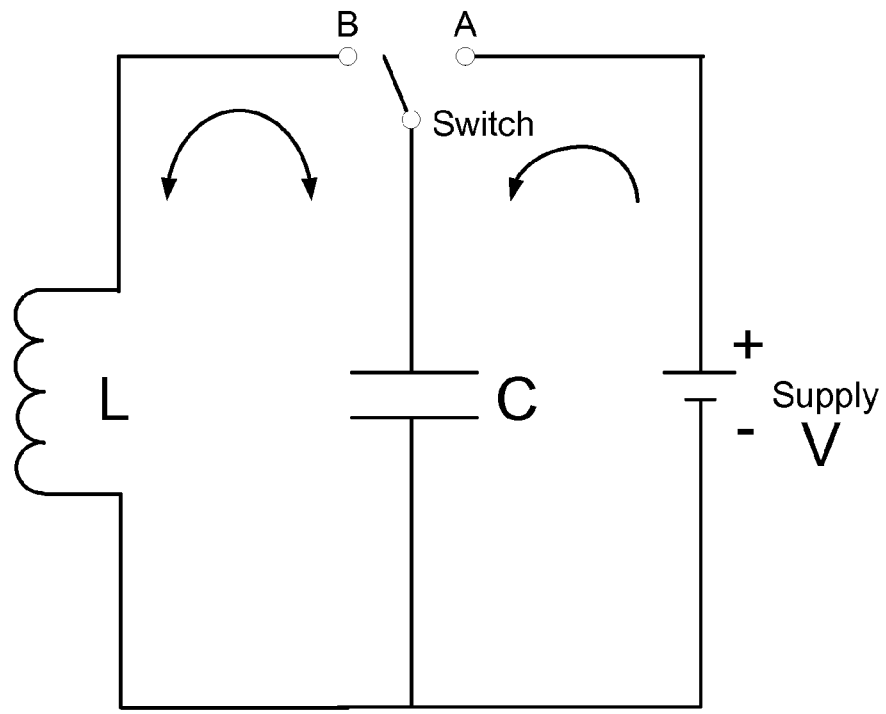
FIG. 1A is a traditional LC oscillator circuit diagram.

FIG. 1A depicts a simple resonance circuit. The resonance circuit consists of an inductive coil L and a capacitor C. The capacitor C stores energy in the form of an electrostatic field and which produces a potential (static voltage) across its plates, while the inductive coil L stores its energy in the form of an electromagnetic field. The capacitor is charged up to the DC supply voltage V by putting the switch in position A. When the capacitor C is fully charged the switch changes to position B.

When the switch is in position B, the charged capacitor C is now connected in parallel across the inductive coil so the capacitor C begins to discharge itself through the coil L. The voltage across C starts falling as the current through the coil L begins to rise. This rising current sets up an electromagnetic field around the coil L which resists this flow of current. When the capacitor C is completely discharged the energy that was originally stored in the capacitor C as an electrostatic field is now stored in the inductive coil L as an electromagnetic field around the coil L windings.

As there is now no external voltage in the resonance circuit to maintain the current within the coil L, it starts to fall as the electromagnetic field begins to collapse. A back electromagnetic field (emf) is induced in the coil (e=−Ldi/dt) keeping the current flowing in the original direction. This current now charges up capacitor C with the opposite polarity to its original charge. The capacitor C continues to charge up until the current reduces to zero and the electromagnetic field of the coil L has collapsed completely.

The energy originally introduced into the circuit through the switch, has been returned to the capacitor C which again has an electrostatic voltage potential across it, although it is now of the opposite polarity. The capacitor C now starts to discharge again back through the coil and the whole process is repeated. The polarity of the voltage changes as the energy is passed back and forth between the capacitor and inductor producing an AC type sinusoidal voltage and current waveform.

This process then forms the basis of an LC oscillator's tank circuit and theoretically this cycling back and forth will continue indefinitely. However, things are not perfect and every time energy is transferred from the capacitor, C to inductor, L and back from L to C some energy losses occur which decay the oscillations to zero over time.

Figure 1B:
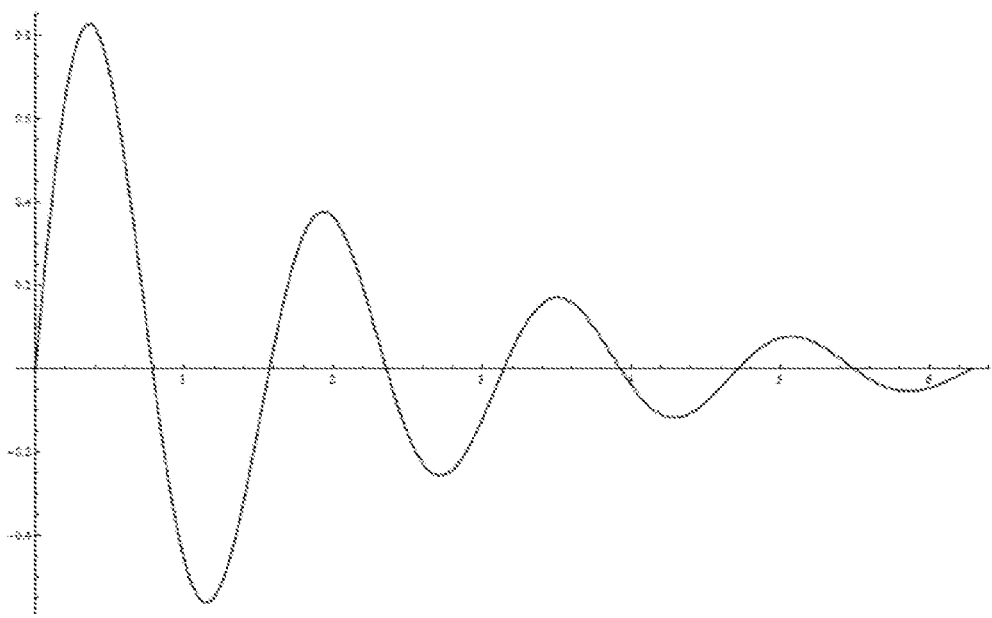
FIG. 1B illustrates the oscillations of the traditional LC oscillator circuit depicted in FIG. 1A.

This oscillatory action of passing energy back and forth between the capacitor C to the inductor L would continue indefinitely if it was not for energy losses within the circuit. Electrical energy is lost in the DC or real resistance of the inductors coil, in the dielectric of the capacitor C, and in radiation from the circuit so the oscillation steadily decreases until they die away completely and the process stops. In a practical LC circuit the amplitude of the oscillatory voltage decreases at each half cycle of oscillation and will eventually die away to zero, as depicted in FIG. 1B. The oscillations are then said to be "damped" with the amount of damping being determined by the quality or Q-factor of the circuit.

The traditional oscillator circuit depicted in FIG. 1A suffers from at least two deficiencies. First the output signal as depicted in FIG. 1B is unsuitable for data transmission due to acute and immediate damping. Second, the switch is a part of the analog circuit that includes the coil L and the capacitor C.

One of the well-known challenges of designing a modern System on Chip (Soc) is that the digital parts of the circuit inside the SoC are needed to be placed away from the analog components because the digital parts of the circuit generate large amounts of noise, especially in the power supply and in the substrate and the noise can interfere with the operations of the analog parts. An ideal solution is to place the digital and the analog parts into two separate integrated circuits. However, doing so increases the designing and manufacturing cost.

Figure 2:
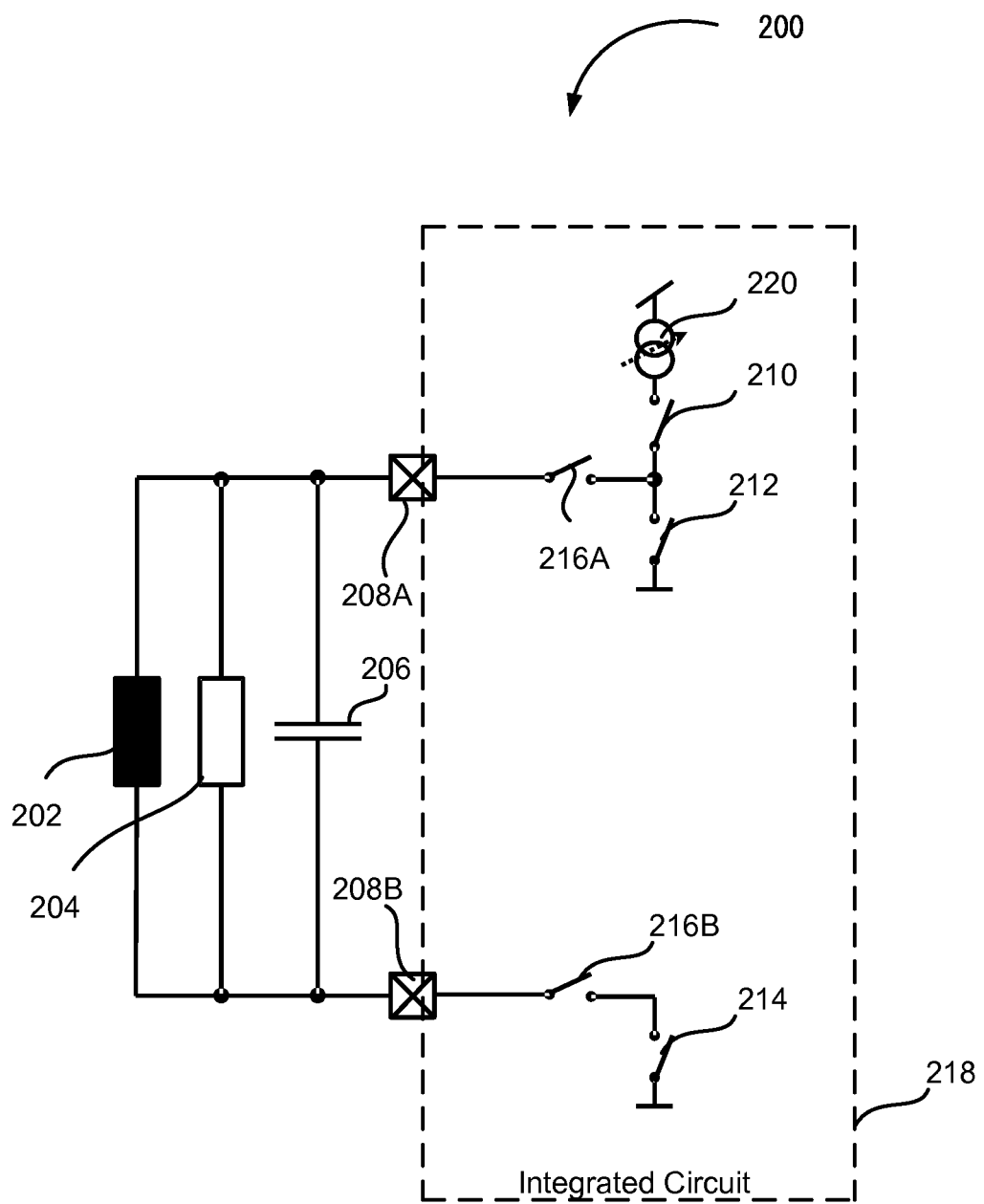
FIG. 2 illustrates an exemplary driver circuit for stimulating a resonance circuit in accordance with an embodiment of the present disclosure.

FIG. 2 illustrates a driver circuit 200 that includes a coil (or inductor) 202 and a capacitor 206. Optionally, to limit the Q-factor, a resister 204 may be included when the series resistance of the coil 202 is low. The quality factor or Q-factor is a dimensionless parameter that describes how underdamped an oscillator or resonator is, or equivalently, characterizes a resonator's bandwidth relative to its center frequency. Higher Q-factor indicates a lower rate of energy loss relative to the stored energy of the resonator; the oscillations die out more slowly.

The boxes 208A and 208B signify integrated circuit pads. Meaning the circuit on the right side of these pads 208A and 208B reside inside an integrated circuit whereas the component on the left side of the pads 208A and 208B reside outside that integrated circuit. The components on the left may be discrete components or may be embodied in a separate integrated circuit. The components shown in the dotted box 218 marked "integrated circuit" are inside one or more integrated circuits. However, to emphasize, the components shown outside the dotted box 218 are outside the integrated circuit(s) that includes the components shown inside the dotted box 218. It should be noted that the components shown inside the integrated circuit 218 are merely exemplary. In some embodiments, there may be an integrated resistor inside the integrated circuit 218 for Q-factor adjustments and some components of the resonance tuning may also be inside the integrated circuit 218. In order not to obfuscate the current disclosure, only components that are necessary for the discussion here are shown.

Having the digital components separate from the analog components eliminates or reduces the noise interference as discussed above. Further, having digital components in a separate package also streamlines circuit or system designing. Because typically digital components take far less space on a wafer compared to analog components, a large number of digital components can be packed in one single integrated circuit. A circuit designer may then add analog components from outside to build a complete system using only a few integrated circuits (in some cases, only one integrated circuit).

Switches 216A, 216B are included for safe switch-off of the external circuit from the circuit inside the integrated circuit 218. It should be noted that more than one integrated circuits may be connected to the external resonance circuit in some embodiments. The switches 216A, 216B can be any transistor switches such as NMOS or NPN BJT. Any transistor that needs a comparatively higher voltage to switch off (such as PMOS because PMOS needs higher voltage than NMOS for switch off) may not be suitable for optimum performance. However, in some embodiments, a PMOS transistor may be used where performance is not a necessary criteria. Preferably a NMOS transistor is used for safe switch off operations because an NMOS switch would prevent too large oscillation amplitude. A constant current source or driver 220 is included to provide a non-variable current to the resonance circuit that includes the coil 202 and the capacitor 206. A switch 210 is coupled to the constant current driver 220. In one embodiment, the switch 210 is a PMOS transistor. The switch 210 is also coupled to a switch 212. The switch 212 is also coupled to the ground. Both the switch 210 and the switch 212 are coupled to the switch 216A. The switch 216A is also coupled to the pad 208A. In one embodiment, the pad 208A is configured to be coupled to the first sides of the coil 202 and the capacitor 206.

The circuit 200 also includes a switch 214 that is coupled to the ground as well as the switch 216B. The switch 216B is further coupled to the pad 208B. The pad 208B is defined to be coupled to the second sides of the coil 202 and the capacitor 206.

In one embodiment, at least the switch 212 is a fast off switch. In a fast off switch, the current ceases immediately when the transistor is turned off. Typically, the current continues to flow for some duration when the transistor is turned off. The transistor is turned off by removing the voltage signal from the gate. Removing the voltage from the gate triggers the turn-off process by extinguishing the electron channel and halting electron injection into the base. Because of their long lifetime and low mobility, holes exit much more slowly. This results in a current "tail" during the turn-off transient. In a fast off transistor, the current transient may be reduced by employing a second gate and activating the second gate prior to the removing the voltage from the first gate. Doing so reduces the injection of hole charge into the base and results in immediate extinction of hole injection once the transistor is switched off. Alternatively, a normal transistor with fast switch off characteristics may be used.

In one or more embodiments, the current source 220 is switchable and configured to be adjusted to provide a desired value of current within a pre-selected range of current values. The lower extreme of the output current value depends on the sensitivity of the base station. If the sensitivity of the base station receiver is low, the current may be adjusted to provide optimum range. A higher output current value will lead to communication being more robust against channel noise. However, the communication distance may be less due to limitations such as in field supplied system; energy stored in a capacitor tends to drain faster. The use of fast off switches increases the speed of oscillation switch off. Switching the current source to an initially higher value increases the speed of oscillation amplitude settling.

Figure 3:
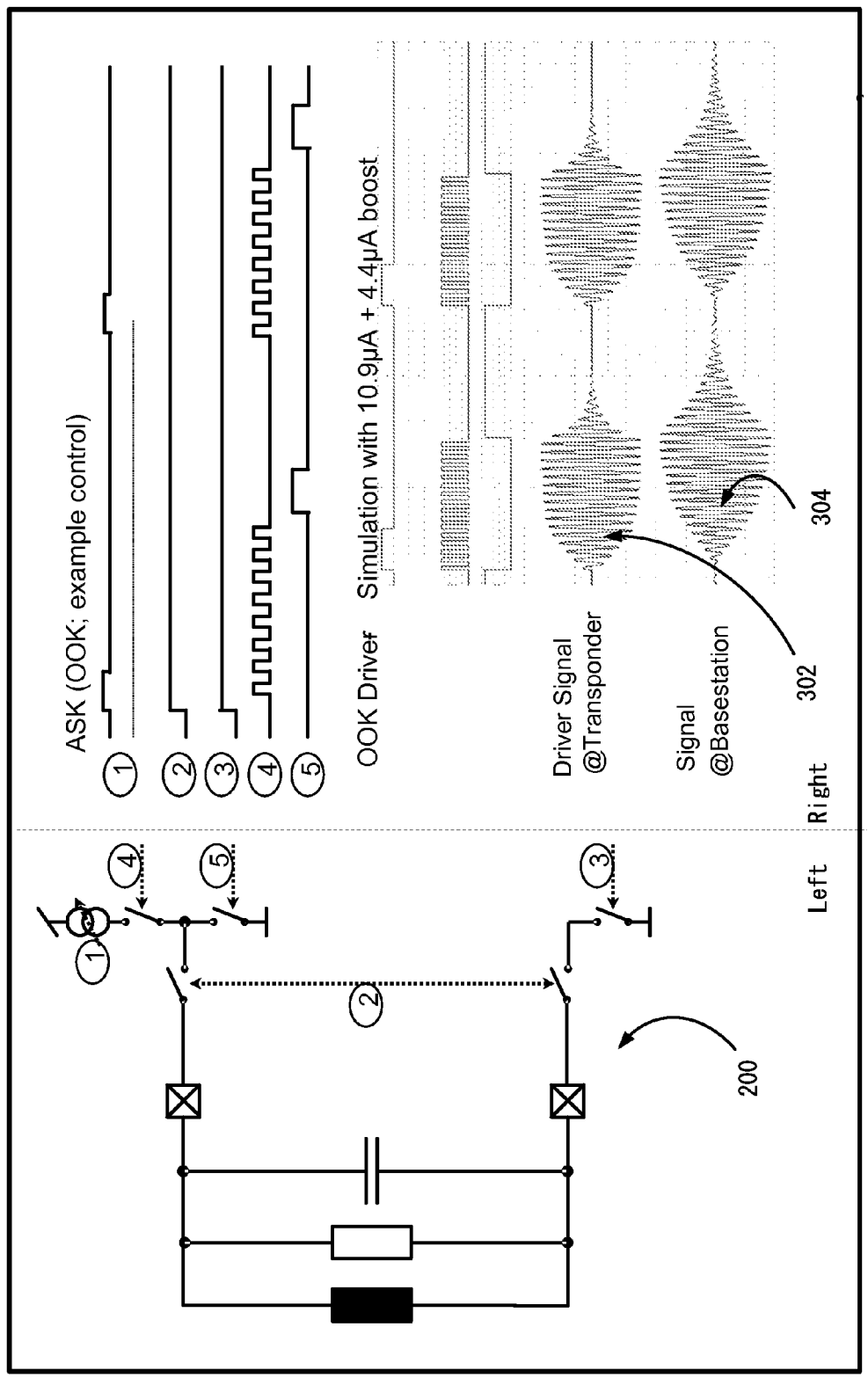
FIG. 3 illustrates exemplary inputs and outputs of the driver circuit illustrated in FIG. 2 in accordance with an embodiment of the present disclosure.

FIG. 3 illustrates generating Amplitude Shift Keying (ASK) modulated signals using the circuit 200 illustrated in FIG. 2. Exemplary switch gate driver signals are marked 2 to 5 (in circles) are applied to the gates of switches of the circuit 200 (signal 1 represents output of the current source 220). The switches are marked 2-5 (in circles) to identify the applied gate driver signal. It should be noted that the input gate driver signal arrangement is merely exemplary. Different types of modulated signals can be generated by selecting an appropriate gate driver signals 2-5. Selection of these driver signals for different types of output modulated signals or waves is within the common knowledge of a person of ordinary skills. Therefore, a detailed discussion is being omitted in order not to obscure this disclosure.

It should be noted that in the present example, a high pulse of signals 2-5 causes when applied to the gate of a switch causes the switch to close. Similarly, a low pulse causes the switch to open.

When the gate driver signals 2-5 are applied to respective switches, as marked, of the circuit 200, the resonance circuit that includes the coil 202 produces an output modulated signal 302. It should be noted that the shape of the output modulated signal 302 can be changed by altering at least some of the date driver signals 2-5. In one embodiment, the selection of the gate driver signals 1-5 is based on the information that need to be encoded in the output modulated signal 302. The signal 304 illustrates an exemplary signal received at the base station (not shown) when the transponder of FIG. 2 transmits the output modulated signal 302. The base station then may decode and extract data from the received signal 304 and perform operations according to a pre-configured method (e.g., if the transmitted modulated signal 302 include a command to open automobile door locks, the base station, after extracting data from the received modulated signal 304, will execute door lock opening sequence).

In one embodiment, the gate driver signals 2-5 may be produced by a digital encoder system (not shown). For example, the digital encoder system can be programmed to produce gate driver signals 1-5 based on the data to be transmitted from the transponder of FIG. 2 to its base station (not shown). Transmitting encoded data via modulated waves is well known, hence a further discussion is being omitted.

Figure 4:
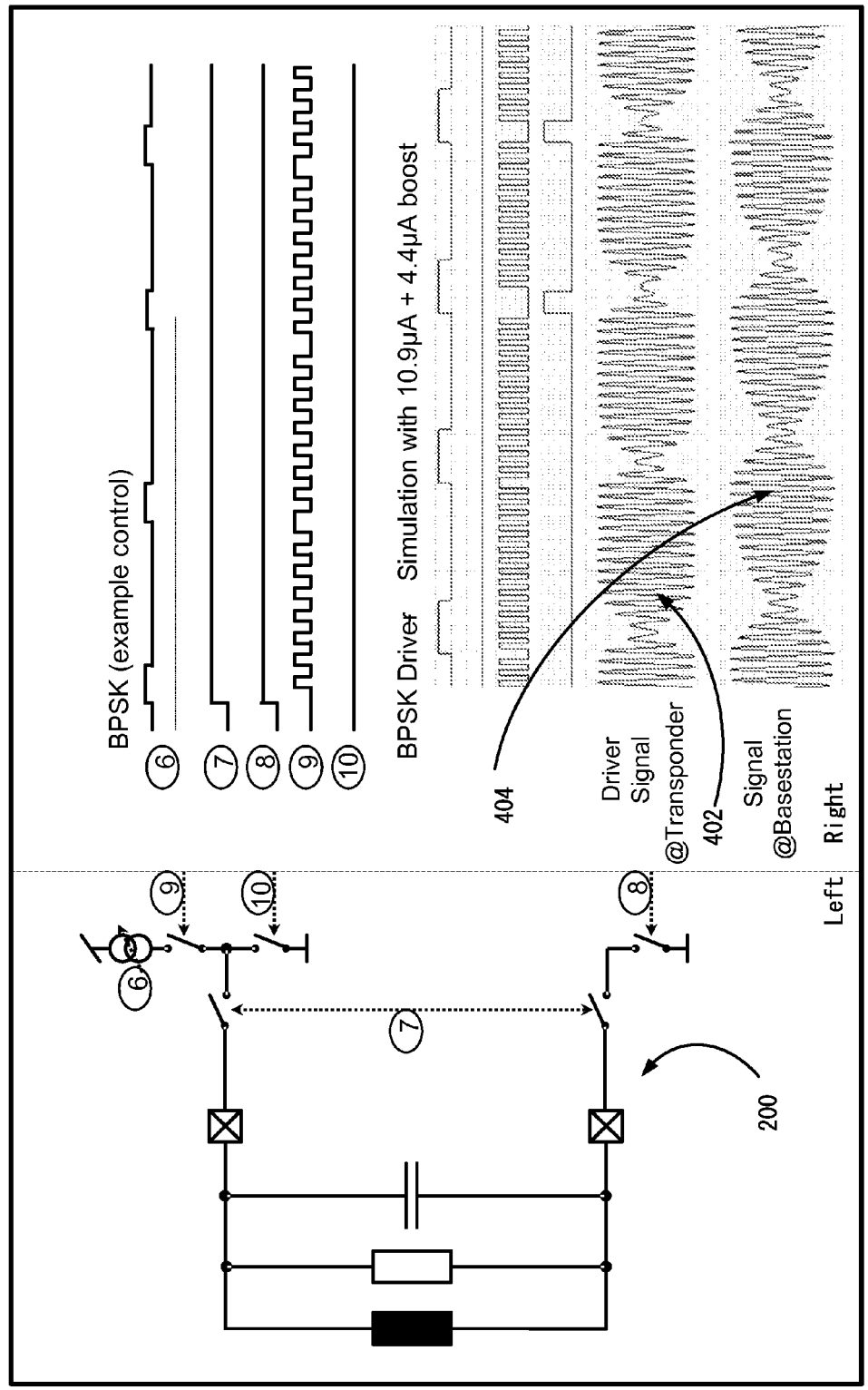
FIG. 4 illustrates another set of exemplary inputs and outputs of the driver circuit illustrated in FIG. 2 in accordance with an embodiment of the present disclosure.

Moving to FIG. 4 that illustrates a use of a different gate driver signal arrangement to produce Binary Phase Shift Keying (PSK or BPSK) modulated output signal 402. FIG. 4 illustrates gate driver signals 6-10 that when applied to the gates of the switches (as marked) of the circuit 200 produce the output modulated signal 302 (signal 6 represents the output of the constant current driver 220) As discussed before, the gate driver signals 6-10 may be altered according to the data to be transmitted to the base station.

The circuit 200 exhibits some limitations in terms of maximum possible voltage swing. This limit may be due to protection diodes or limiter circuits towards high or low side excitation, which could lead to energy being wasted if too much current is applied to the circuit 200.

Figure 5:
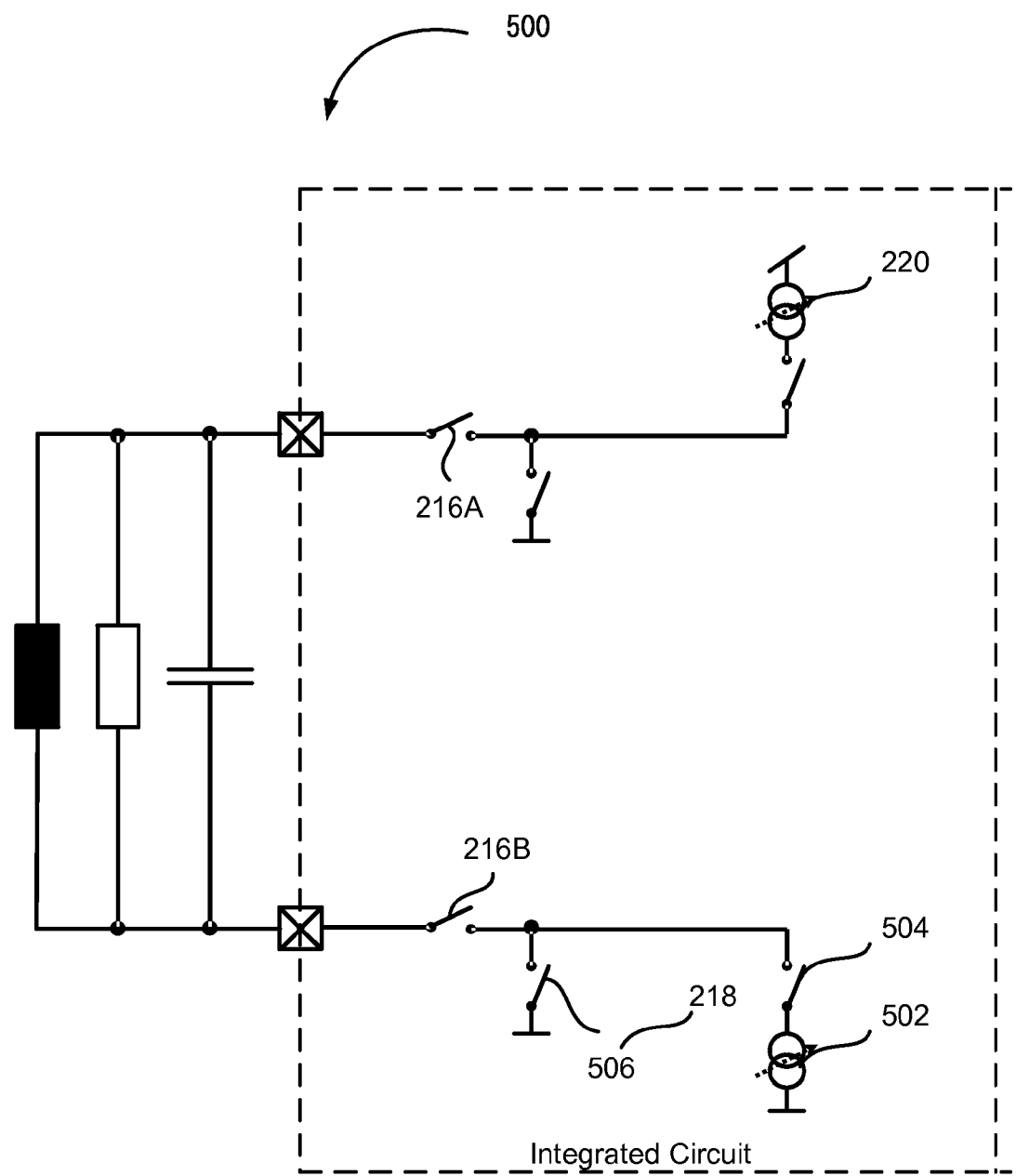
FIG. 5 illustrates an exemplary double sided driver circuit for increasing output amplitude in accordance with an embodiment of the present disclosure.

FIG. 5 illustrates further improved circuit 500 for generating modulated signals. In this driver version the ground switch is replaced by a second current source 502. The second current source 502 may an output of the current source 220. Alternatively, the second current source 502 may be an independent constant current driver. The second constant current source 502 is coupled to a switch 504 that is also coupled to another switch 506. The switch 506, in one embodiment, is a fast off switch. In one implementation, the switch 506 includes two gates.

Using only current sources and no fixed voltages leads to the effect, that the oscillation will automatically find the DC operating point with the maximum possible amplitude swing. In one embodiment, DC operating point or the optimal DC offset means average voltage without AC or varying signal part. Any leakage on one side of the oscillation swing would lead to a DC-shift into the other direction until the optimum DC operating point is settled. The switches 216A, 216B are preferably NMOS transistors. The NMOS switches cause an automatic reduction of drive current rather than dumping excessive current into some protection circuits (not shown). If the voltage goes up due to leakage on low side of oscillation, the NMOS switch will softly switch off current on high side. The circuit 200, 500, 600 implements an effective Q-factor reduction features such as fast switch off and/or boost current at the beginning.

In one embodiment, a perfect matching of the two current sources 220, 502 is not required as this would only shift the DC operating point until the average current from both sides is equal again.

Figure 6:
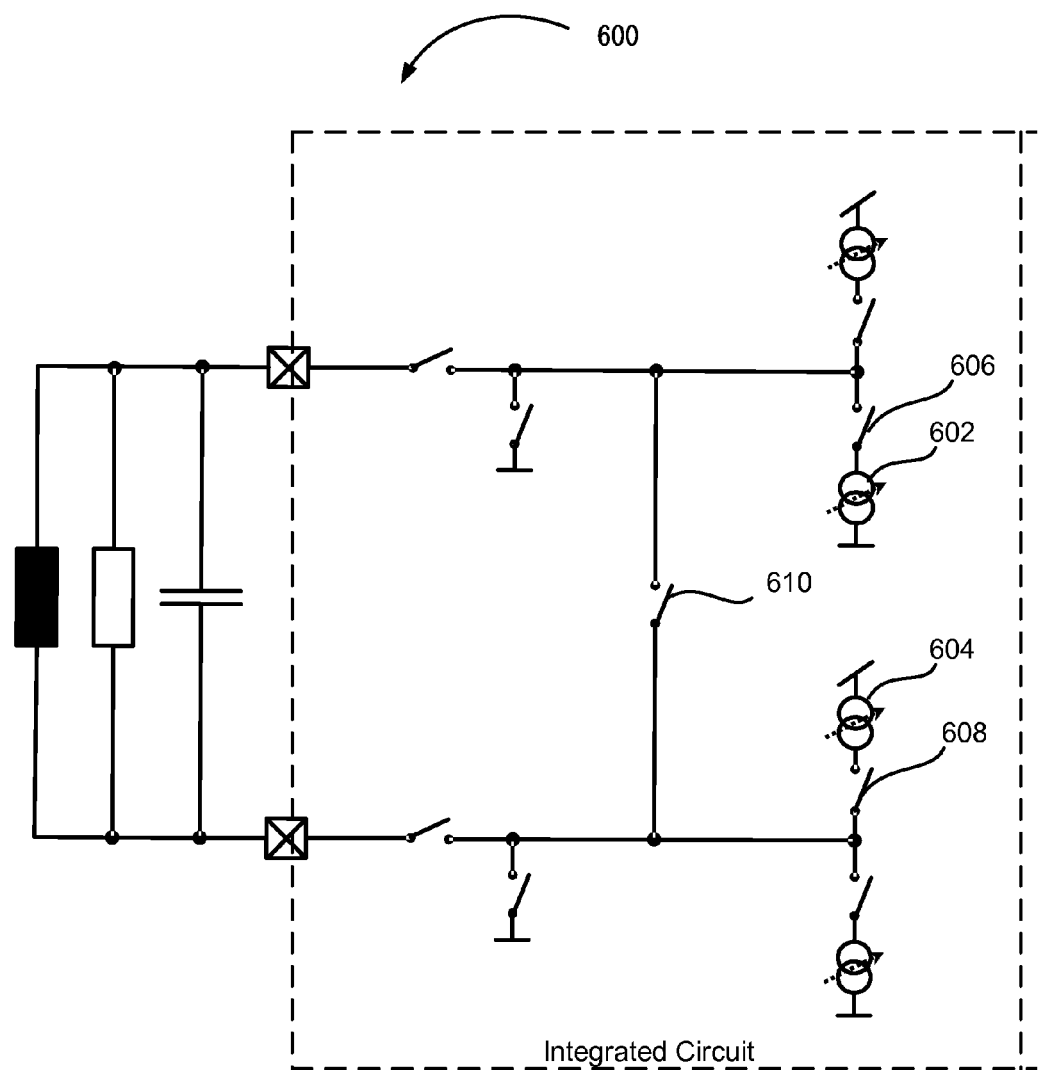
FIG. 6 illustrates an exemplary double sided driver circuit for increasing output amplitude and current in accordance with an embodiment of the present disclosure.

The circuit 500 shows in FIG. 5, however, can only supply current into the resonant circuit connected to the integrated circuit pads for half of the period. FIG. 6 shows a further improved circuit 600 for generating modulated signals. In addition to the components included in the circuit 500, the circuit 600 further includes two additional current sources 602, 604. The current source 602 is coupled to a switch 606 and the current source 604 is coupled to a switch 608. The switches 606 and 608 are coupled together through a switch 610. In one embodiment, with appropriate connections, instead of four current sources, only two may be used as only one set of current sources may be active at a time. The shorting switch 610 help to improve energy efficiency for BPSK modulation. Effect of the switch 610 is similar to using a boosting current at the beginning of the new modulation phase (faster transition between the two phases) without using additional current.

It should be noted that even though the disclosure uses keyless entry system to explain various circuits, a person of ordinary skills will realize that the circuits described herein may also be used in other applications that require data communication between two components. In particular, the circuits described herein may be used in systems requiring remote control of operations. In one example, the circuit described herein are used in a field supplied power applications such as in a field supplied backup link for a remote keyless entry immobilizer system.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims as set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

Preferred embodiments are described herein, including the best mode known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

What is claimed is:

1. A circuit for generating a modulated signal, comprising:
a constant current source;
a first switch coupled to the constant current source;
a second switch coupled to the first switch and a ground, wherein the first switch and the second switch are coupled to a third switch, the third switch is coupled to a first integrated circuit pad, wherein the first integrated circuit pad is defined to be used for coupling the third switch to a resonance circuit and
a fourth switch coupled to the ground and a fifth switch.

2. The circuit of claim 1, wherein the fifth switch is coupled to a second integrated circuit pad, wherein the second integrated circuit pad is defined to be used for coupling the fifth switch to the resonance circuit.

3. The circuit of claim 1 wherein the circuit is embodied in one single integrated circuit having the first integrated circuit pad and the second integrated circuit pad.

4. The circuit of claim 3, wherein the one single integrated circuit is configured to be connected to the resonance circuit that includes a coil and a capacitor, wherein the coil and the capacitor are connected in parallel.

5. The circuit of claim 1, wherein the first switch, the second switch and the third switch are configured to be operated by a plurality of signal sources, each of the plurality of signal source is configured to produce different types of digital control signals.

6. The circuit of claim 5, wherein the digital control signals are arranged to produce Amplitude Shift Keying (ASK) modulation.

7. The circuit of claim 5, wherein the digital control signals are arranged to produce Phase Shift Keying (PSK) modulation.

8. The circuit of claim 1, wherein the second switch is fast off switch having a second gate to increase turn off speed of the second switch.

9. There circuit of claim 1, wherein the third switch is a NMOS transistor.

10. A circuit for generating a modulated signal, comprising:
a first constant current source;
a first switch coupled to the constant current source;
a second switch coupled to the first switch and a ground, wherein the first switch and the second switch are coupled to a third switch, the third switch is coupled to a first integrated circuit pad; and
a second current source coupled to a fourth switch that is coupled to a fifth switch, wherein the fifth switch is coupled to a sixth switch, the sixth switch is coupled to a second integrated circuit pad.

11. The circuit of claim 10, wherein the first current source and the second current source are outputs of a same current source.

12. The circuit of claim 10, wherein the first current source and the second current source are independent circuits coupled to a same power source.

13. The circuit of claim 10, wherein the third switch and the sixth switch are NMOS transistors.

14. A circuit for generating a modulated signal, comprising:
 a first constant current source coupled to a first switch;
 a second constant current source coupled to a second switch and a ground, wherein the first switch is coupled to the second switch, wherein the first switch and the second switch are coupled to a third switch; and
 a third constant current source coupled to a fourth switch, the fourth switch is coupled to a fifth switch, wherein the fifth switch is coupled to a fourth constant current source, wherein the fourth switch and the fifth switch are coupled to a sixth switch,
 wherein the first switch and the second switch are coupled to the fourth switch and the fifth switch through a seventh switch.

15. The circuit of claim 14, wherein the third switch is coupled to an eighth switch that is coupled to a first integrated circuit pad.

16. The circuit of claim 15, wherein the sixth switch is coupled to a ninth switch that is coupled to a second integrated circuit pad.

17. The circuit of claim 14 wherein the third switch is further coupled to a ground.

18. The circuit of claim 14, wherein the first constant current source and the second constant current source are outputs of a same current source.

19. The circuit of claim 14, wherein the first constant current source and the second constant current source are outputs of different current sources.

* * * * *